(12) United States Patent
Knauer

(10) Patent No.: US 8,507,802 B1
(45) Date of Patent: Aug. 13, 2013

(54) ULTRA-LOW CURRENT PRINTED CIRCUIT BOARD

(75) Inventor: William Knauer, Chagrin Falls, OH (US)

(73) Assignee: Keithley Instruments, Inc., Cleveland, OH (US)

( * ) Notice: Subject to any disclaimer, the term of this patent is extended or adjusted under 35 U.S.C. 154(b) by 837 days.

(21) Appl. No.: 12/113,617

(22) Filed: May 1, 2008

(51) Int. Cl.
*H05K 1/00* (2006.01)

(52) U.S. Cl.
USPC ........... 174/255; 174/250; 174/251; 174/252; 174/253; 174/254; 174/256; 174/257; 174/260; 174/261; 174/262; 361/776; 361/777

(58) Field of Classification Search
USPC .............. 174/250–257, 260–262; 361/776, 361/777
See application file for complete search history.

(56) References Cited

U.S. PATENT DOCUMENTS

| | | | |
|---|---|---|---|
| 5,490,325 A | 2/1996 | Niemann et al. | |
| 5,803,344 A * | 9/1998 | Stankavich et al. | 228/180.22 |
| 6,558,168 B2 | 5/2003 | Iwasaki | |
| 7,042,241 B2 * | 5/2006 | Tervo et al. | 324/756.03 |
| 2007/0268030 A1 | 11/2007 | Knauer et al. | |

* cited by examiner

*Primary Examiner* — Jinhee Lee
*Assistant Examiner* — James Wu
(74) *Attorney, Agent, or Firm* — Pearne & Gordon LLP

(57) ABSTRACT

Provided is printed circuit board for minimizing dielectric losses experienced by a low-current portion of an electric circuit. The printed circuit board includes a first substrate supporting an electrically-conductive material patterned to form a conductive pathway between electric circuit components, and a surface-mount guard pad provided on a substantially-planar exposed surface of the first substrate and covering at least an area of the exposed surface including a footprint of the low-current portion on the first substrate. A second substrate is also provided with one or more electrically conductive pads that are surface mounted to the guard pad to couple the second substrate to the guard pad. The second substrate also supports a signal trace included in the low-current region for conducting a low-current signal.

12 Claims, 3 Drawing Sheets

ULTRA-LOW CURRENT PRINTED CIRCUIT BOARD

BACKGROUND OF THE INVENTION

1. Field of the Invention

The present invention is directed generally toward precision electrical measurement devices and, more specifically, to printed circuit boards for measurement devices including a low-current measuring region isolated from neighboring regions of the printed circuit board.

2. Description of Related Art

In devices for measuring very low currents (e.g., nanoamperes and below), the dielectric material of printed circuit boards absorb unacceptable numbers of electrons or other charge carriers at the low current nodes of the devices. This absorption, referred to as dielectric absorption, can introduce significant error levels into the measured current due to the low magnitude of the current being measured.

Efforts to minimize dielectric absorption have typically included insulating a test terminal 1 with a dielectric 7 recessed within an uppermost layer 5 of a substrate, as shown in FIG. 1. To form such a structure, a portion of the substrate's uppermost layer 5 must first be machined away, leaving a void 9. Each of the side walls defining the void is plated with an electrical conductor 3. An electrical conductor 4 is also provided to the floor of the void 9, thereby forming a conductive liner recessed within the uppermost layer 5 of the substrate. With the liner and dielectric 7 recessed in this manner, the test terminal 1 is located approximately flush with an exposed surface 8 of the uppermost layer 5 of substrate.

Although isolating a test terminal 1 with a dielectric 7 that is embedded and separated from the substrate's uppermost layer 5 is an approach for addressing dielectric losses encountered when measuring low-currents, such a structure has several shortcomings. In order to form such a structure a portion of the substrate must first be removed to form the void 9. This weakens the mechanical strength of the substrate, and requires milling operations to be performed, adding to the complexity and cost of manufacturing such substrates. Further, such structures are not practical for insulating much more than the test terminal 1 shown in FIG. 1 due to the extensive machining that would be required, causing significant weakening of the substrate's rigidity.

Accordingly, there is a need in the art for a method and apparatus for minimizing dielectric losses experienced by circuits for conducting measurements of low currents. The method and apparatus can minimize manufacturing complexity and cost, guard against dielectric loss in desired regions of a printed circuit board, and can have sufficient mechanical strength to minimize damage to electrical components that extend between a guarded region and an adjacent region.

BRIEF SUMMARY OF THE INVENTION

According to one aspect, the present invention provides a printed circuit board for minimizing dielectric losses experienced by a low-current portion of an electric circuit. The printed circuit board comprises a first substrate supporting an electrically-conductive material patterned to form a conductive pathway between electric circuit components; a surface-mount guard pad provided on a substantially-planar exposed surface of the first substrate and covering at least an area of the exposed surface including a footprint of the low-current portion on the first substrate; and a second substrate comprising one or more conductive pads that are surface mounted to the guard pad to couple the second substrate to the guard pad, wherein the second substrate supports a signal trace included in the low-current region for conducting a low-current signal.

According to another aspect, the present invention provides a printed circuit board for minimizing dielectric losses experienced by a low-current portion of an electric circuit. The printed circuit board comprises a first substrate supporting an electrically-conductive material patterned to form one or more surface-mount guard pads on a substantially-planar exposed surface of the first substrate covering at least an area of the exposed surface that encompasses a footprint of the low-current portion of the electric circuit. A second substrate comprising at least one void separating a first guarded region of the second substrate from a second guarded region of the second substrate is also provided. At least one of the first and second guarded regions supports the low-current portion of the electric circuit, and the second substrate is surface mounted to the first substrate and the at least one of the first and second guarded regions supporting the low-current portion of the electric circuit is separated from the first substrate by the one or more guard pads.

BRIEF DESCRIPTION OF THE DRAWINGS

The invention may take physical form in certain parts and arrangement of parts, embodiments of which will be described in detail in this specification and illustrated in the accompanying drawings which form a part hereof and wherein.

DETAILED DESCRIPTION OF ILLUSTRATIVE EMBODIMENTS

Figure 1:
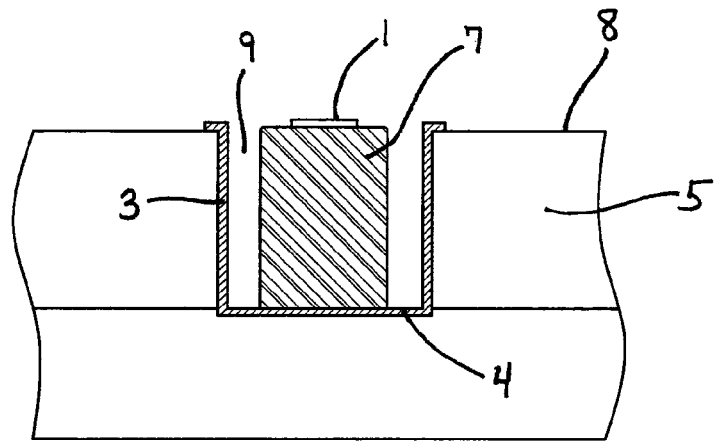
FIG. 1 is a cross sectional view of a prior art dielectric loss insulator.

Certain terminology is used herein for convenience only and is not to be taken as a limitation on the present invention. Relative language used herein is best understood with reference to the drawings, in which like numerals are used to identify like or similar items. Further, in the drawings, certain features may be shown in somewhat schematic form.

It is also to be noted that the phrase "at least one of", if used herein, followed by a plurality of members herein means one of the members, or a combination of more than one of the members. For example, the phrase "at least one of a first widget and a second widget" means in the present application: the first widget, the second widget, or the first widget and the second widget. Likewise, "at least one of a first widget, a second widget and a third widget" means in the present application: the first widget, the second widget, the third widget, the first widget and the second widget, the first widget and the third widget, the second widget and the third widget, or the first widget and the second widget and the third widget.

Figure 2:
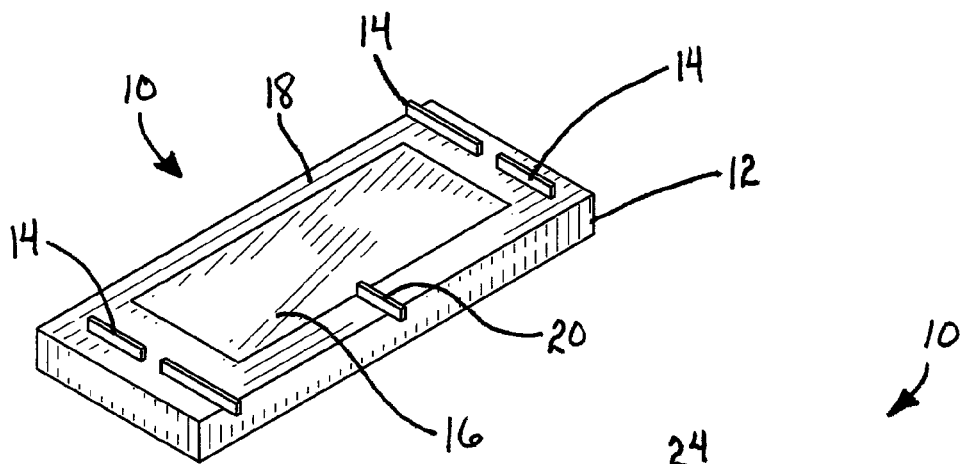
FIG. 2 is a partial perspective view of a printed circuit board supporting a plurality of conductive traces and a surface-mount guard pad according to an aspect of the invention.

An embodiment of a first substrate 12 of a printed circuit board ("PCB") 10 for minimizing dielectric losses experienced by a low-current portion of an electric circuit is shown in FIG. 2. As shown, the substrate 12 forms the base of the PCB 10 and is formed from a suitable dielectric material such as synthetic resins, including reinforced polycarbonates, polyimides, and any other suitable materials commonly used to fabricate substrates for electric circuits. The substrate 12 supports an electrically-conductive material such as copper, for example, that has been patterned to form one or more conductive pathways commonly referred to as traces 14 that conduct electric signals between electric circuit components (not shown). Patterning and forming the traces 14 can be accomplished by wet etching, routing (or other suitable milling procedure), laser etching, and the like.

The substrate 12 in FIG. 2 also includes a surface-mount guard pad 16 provided on a substantially-planar exposed surface 18 of the substrate 12. As a surface-mount pad, the guard pad 16 forms a substantially planar surface to which electric circuit components can be mounted onto the surface of the PCB 10 without requiring the extension of conventional leads through the PCB 10 before being soldered or otherwise adhered to a conductive component of the PCB 10. Like any surface-mount pads, the guard pad 16 can optionally include a re-flowable circuit mounting, conductive fastener such as solder, pre-formed solder balls, solder paste, and other such known circuit-mounting materials provided to either, or both of the component being mounted and/or the guard pad 16. The traces 14 can also optionally be provided with such re-flowable or other suitable circuit component fastening material to facilitate surface mounting of electric circuit components thereto. Circuit components so mounted can communicate via electric signals with other similarly mounted circuit components via the traces 14 or other conductors.

A guard trace 20 can also optionally be provided to the first substrate 12 or other portion of the present invention to conduct a "guard potential" to the guard pad 16. The guard potential can be any potential that serves to mitigate dielectric losses experienced by a low-current signal in a low-current circuit that is at least partially supported by a second substrate 22 as discussed in detail below with respect to FIG. 3. The guard potential is to be applied to the guard pad 16 while the electric current of the low-current signal is being measured to prevent significant attenuation of the low-current signal, leading to erroneous current measurements. Dielectric loss can render current measurements erroneous due to the low magnitude of the current being measured, such as nano-amperes and below, for example. Embodiments of the present invention can optionally measure electrical currents on the order of femto-amperes, for example.

Figure 3:
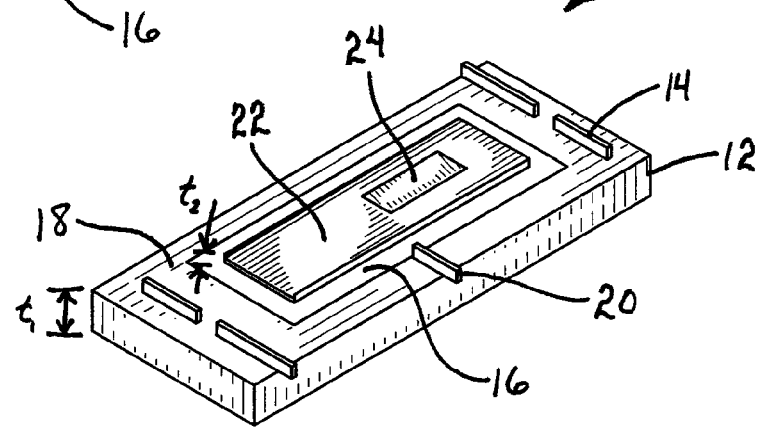
FIG. 3 is a partial perspective view of a printed circuit board supporting a plurality of conductive traces and a second substrate surface-mounted to a guard pad according to an aspect of the invention.

For the embodiment of the PCB 10 shown in FIG. 3, a low-current electric circuit 24 including at least one signal trace included in the low-current circuit 24 for conducting a low-current signal. The low-current circuit 24 conducts an electric current of a magnitude that will be significantly attenuated by dielectric losses, and for which the dielectric loss can not be considered negligible according to sound engineering principles. It is the electric current of this low-current circuit 24 that is to be measured by an electrical measuring device (not shown).

In FIG. 3, the guard pad 16 covers an area of the exposed surface 18 of the PCB 10 that includes the footprint of the low-current circuit 24, which can be a low-current portion of an overall circuit split between the first and second substrates 12, 22, or a stand-alone circuit. The footprint of an object on the first substrate 12 is considered to be the area of the exposed surface directly beneath that object. Thus, the footprint of the second substrate 22, considered to be the low-current region in this example, on the exposed surface 18 of the first substrate 12 is the dimensions of the second substrate 22 projected vertically down onto the first substrate 12. Thus, the guard pad 16 covers a surface area of the first substrate 12 that includes the width and length of the second substrate 22. So sized, the guard pad 16 separates the entire second substrate 22 from the first substrate 12.

The second substrate 22 is coupled to, and completely encompassed within the dimensions of the guard pad 16 in FIG. 3. To facilitate coupling of the second substrate 22 to the guard pad 16, the second substrate 22 can include one or more conductive pads on a surface facing the guard pad 16 when the second substrate 22 is coupled to the guard pad 16. These pads, the guard pad 16 itself, or a combination thereof can optionally be provided with the re-flowable solder or other suitable fastening and electrically conductive material to facilitate surface mounting of the second substrate 22 to the exposed surface 18 of the first substrate 12.

The thickness $t_2$ of the second substrate 22 is less than a thickness $t_1$ of the first substrate 12 in FIG. 3 to minimize the amount of the dielectric material not separated from the low-current circuit 24 by the guide pad 16 to which the low-current circuit 24, and accordingly, the low-current signal is exposed. Minimizing the thickness of the dielectric material to which the low-current circuit is exposed serves to minimize dielectric loss.

Figure 4:
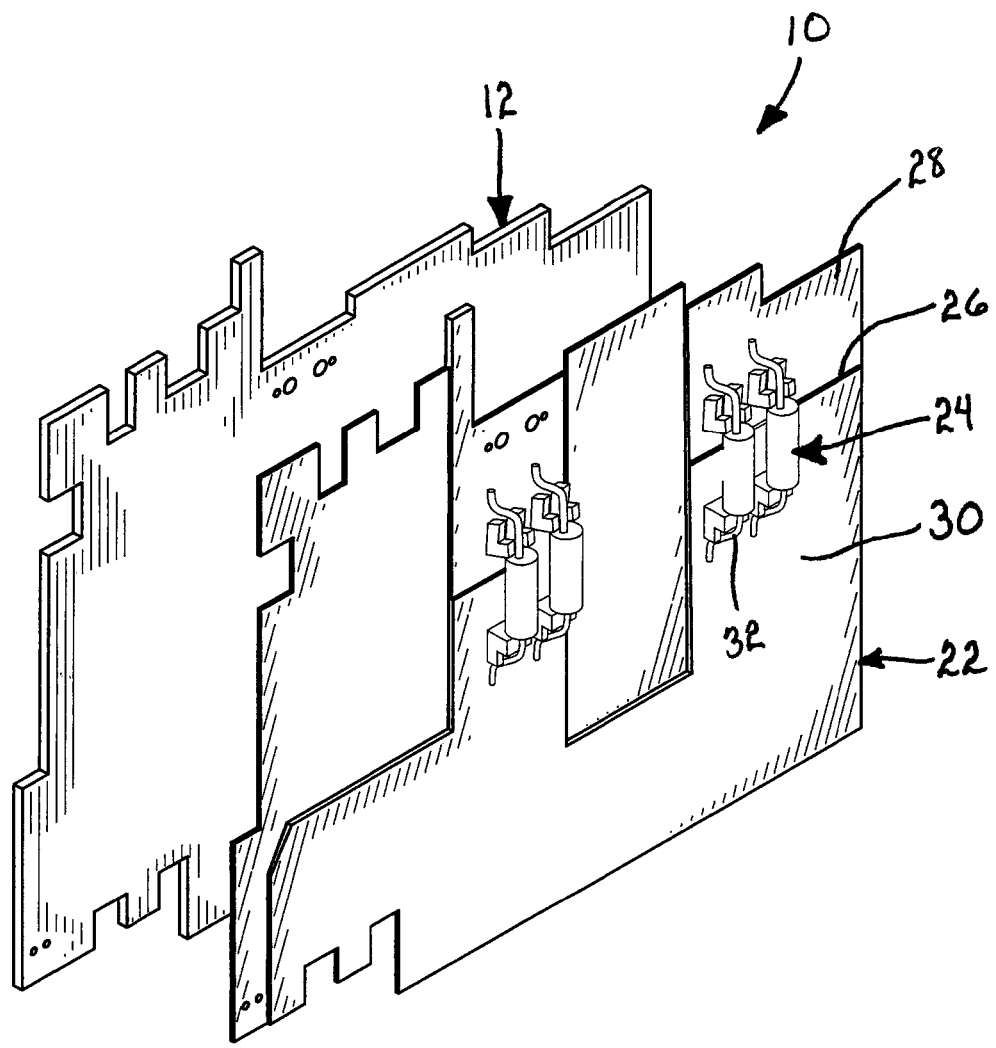
FIG. 4 is a partial exploded view of a printed circuit board including one or more circuit components extending across a void formed in a second substrate according to an aspect of the invention.

An embodiment of the present invention shown in FIG. 4 includes a second substrate 22 supporting the low-current circuit 24 that includes at least one void 26 formed therein, separating a first guarded region 28 of the second substrate 22 from a second guarded region 30 of the second substrate 22. "Guarded" regions are those portions of the second substrate 22 that are separated from the first substrate 12 by a guard pad 16 when the second substrate 22 is coupled to the first substrate 12. Optionally, a separate surface-mount guard pad 16 can be provided to the first substrate 12 for separating each of the first and second guarded regions 28, 30 from the first substrate 12.

Guarded regions are also guarded from each other in the sense that at least a portion of the dielectric material of the substrate 22 is absent where the neighboring regions meet. The void 26 can be in the form of an elongated, empty channel that extends entirely through a thickness $t_2$ of the second substrate 22. The guarded regions 28, 30 maintain a generally fixed relative position to each other when mounted to the substrate 12, as shown in FIG. 4.

According to alternate embodiments, the void 26 can optionally include one or more apertures (not shown) separating neighboring regions of the substrate 22. For such embodiments, stems of the dielectric material can establish the physical connection between the neighboring regions of the substrate 22. An example of the stems can be found in U.S. Pat. No. 5,490,325 to Niemann et al., which is incorporated in its entirety herein by reference.

But regardless of the form of the void 26, "guarding" one region, such as region 28 for example, from neighboring region 30 with the void 26 minimizes the dielectric material forming the physical connection between the regions 28, 30, thereby minimizing dielectric loss across the void 26 from one region 28 to the neighboring region 30.

Although regions of the second substrate 22 are guarded from each other by the void 26, there can still be electrical communication between the guarded regions. For example, one or more electric circuit components 32 extend between the first and second guarded regions 28, 30 of the second substrate 22 over the void 26. Suitable circuit components are selected based on the application for which the PCB 10 is to be used, and include any conventional circuit components, including brittle components such as ceramic capacitors.

Brittle components have to this point not been installed between regions of a substrate 22 separated by a void 26 due to the tendency of conventional PCBs 10 to flex because of the reduced structural strength of the substrate 22 by inclusion of the void 26. However, the first and second substrates 12, 22 are surface mounted together by, for example, soldering (as mentioned above) two or more substrates 12, 22 together as an after-market step, conventional lamination techniques when the PCB 10 is manufactured, or any other suitable surface mounting techniques where planar surfaces of the substrates 12, 22 are coupled together without requiring the insertion of leads through holes extending entirely through the substrates 12, 22.

Figure 5:
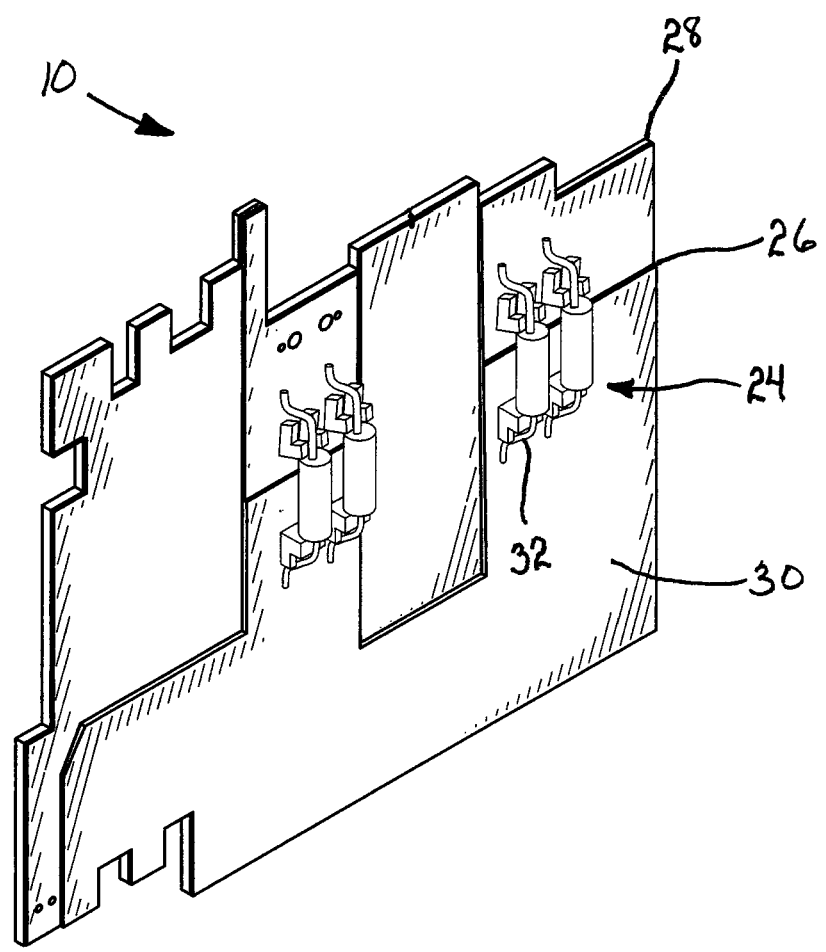
FIG. 5. is a partial perspective view of the substrates shown in FIG. 4 surface mounted together to form a printed circuit board according to an aspect of the invention.

The substrates 12, 22 shown in the exploded view of FIG. 4 are also to be coupled together as shown in FIG. 5 to afford the second substrate 22 structural support and minimize physical deformation of the second substrate 22 at the void(s) 26. A guard pad 16 can be formed on the first substrate 12 for each region of the second substrate 22, and one or both planar surfaces of each substrate 12, 22 can optionally include an electrically conductive material deposited thereon to be patterned into a network of conductive traces. The interconnections between the electric components provided to the second substrate 22 can be established with blind vias, which are known in the art as being conductive pathways that extend depthwise through the substrate 22 between a conductive trace on each side of the substrate 22. They are referred to as "blind" vias in that they do not extend entirely through the substrate 22, but instead terminate within the substrate. Likewise, the guard trace 20 can be formed as a trace as shown above in FIGS. 2 and 3, as one or more vias extending in a depthwise direction through one or both of the substrates 12, 22, as one or more through holes extending through all four planar surfaces of the substrates 12, 22 plated with an electrical conductor, or any other suitable current carrying member.

Illustrative embodiments have been described, hereinabove. It will be apparent to those skilled in the art that the above devices and methods may incorporate changes and modifications without departing from the general scope of this invention. It is intended to include all such modifications and alterations within the scope of the present invention.

What is claimed is:

1. A printed circuit board for minimizing dielectric losses experienced by a low-current portion of an electric circuit comprising:
    a first substrate including a substantially-planar exposed surface having an electrically-conductive material patterned to form a conductive pathway between electric circuit components, the conductive pathway been directly on the substantially-planar exposed surface;
    a surface-mount guard pad provided on said substantially-planar exposed surface of the first substrate and covering at least an area of the exposed surface including a footprint of the low-current portion on the first substrate; and
    a substantially-planar second substrate comprising one or more conductive pads that are surface mounted to the guard pad by a solder layer to couple one side of the second substrate to the guard pad, wherein the other side of the second substrate supports a signal trace included in the low-current region for conducting a low-current signal.

2. The printed circuit board according to claim 1, wherein a thickness of the second substrate is less than a thickness of the first substrate.

3. The printed circuit board according to claim 1, wherein the footprint of the low-current region is defined by a width and a length of the second substrate, and the guard pad separates the entire second substrate from the first substrate.

4. The printed circuit board according to claim 1 further comprising:
    at least one void formed in the second substrate separating a first guarded region of the second substrate from a second guarded region of the second substrate; and
    a separate surface-mount guard pad provided to the first substrate for separating each of the first and second guarded regions from the first substrate.

5. The printed circuit board according to claim 4, further comprising at least one electric circuit component extending between the first and second guarded regions of the second substrate over the void.

6. The printed circuit board according to claim 4, wherein the void is formed as an elongated channel that extends through a thickness of the second substrate to divide the second substrate into a plurality of separate guarded regions.

7. The printed circuit board according to claim 1, wherein the second substrate has an exposed surface area that is less than an area of the exposed surface of the first substrate.

8. A printed circuit board for minimizing dielectric losses experienced by a low-current portion of an electric circuit comprising:
    a first substrate including a substantially-planar exposed surface having an electrically-conductive material patterned to form a conductive pathway between electric circuit components, the conductive pathway been directly on the substantially-planar exposed surface; and
    an electrically-conductive material patterned to form one or more surface-mount guard pads on the substantially-planar exposed surface of the first substrate and covering at least an area of the exposed surface that encompasses a footprint of the low-current portion of the electric circuit; and
    a substantially-planar second substrate comprising at least one void separating a first guarded region of the second substrate from a second guarded region of the second substrate, wherein
        at least one of the first and second guarded regions supports the low-current portion of the electric circuit on an exposed side of said second substrate, and
        the second substrate is surface mounted to the first substrate by a solder layer and the at least one of the first and second guarded regions supporting the low-current portion of the electric circuit is separated from the first substrate by the one or more guard pads.

9. The printed circuit board according to claim 8, wherein the one or more guard pads supported by the first substrate comprises a separate surface-mount guard pad for separating each of the first and second guarded regions from the first substrate.

10. The printed circuit board according to claim 8, wherein a thickness of the second substrate is less than a thickness of the first substrate.

11. The printed circuit board according to claim 8, further comprising at least one electric circuit component extending between the first and second guarded regions of the second substrate over the void.

12. The printed circuit board according to claim 8, wherein the void is formed as an elongated channel that extends through a thickness of the second substrate to divide the second substrate into a plurality of separate guarded regions.

* * * * *